United States Patent
Hume et al.

(10) Patent No.: US 6,414,389 B1
(45) Date of Patent: Jul. 2, 2002

(54) ALIGNMENT PEDESTALS IN AN LDMOS POWER PACKAGE

(75) Inventors: Jeff Hume, El Granada; Henrik Hoyer, Los Gatos; Thomas Moller, Gilroy, all of CA (US)

(73) Assignee: Ericsson Inc., Plano, TX (US)

( * ) Notice: Subject to any disclaimer, the term of this patent is extended or adjusted under 35 U.S.C. 154(b) by 0 days.

(21) Appl. No.: 09/493,297

(22) Filed: Jan. 28, 2000

(51) Int. Cl.[7] .............................................. H01L 23/12
(52) U.S. Cl. ........................ 257/732; 257/691; 257/723; 257/711
(58) Field of Search ................................ 257/732, 723, 257/731, 730, 711

(56) References Cited

U.S. PATENT DOCUMENTS 4,215,360 A * 7/1980 Eytcheson .................... 357/70
6,060,795 A * 5/2000 Azotea et al. ............... 307/105

* cited by examiner

Primary Examiner—Roy Potter
(74) Attorney, Agent, or Firm—Lyon & Lyon LLP

(57) ABSTRACT

An LDMOS power package includes a mounting substrate having a surface with one or more alignment pedestals extending therefrom. Each alignment pedestal has a mounting surface facing away from the substrate surface to provide for uniform positioning of various semiconductor elements, e.g., a transistor die or impedance matching capacitors, relative to the substrate surface. The respective pedestal mounting surfaces are preferably conductive, and are electrically coupled to the flange surface, so as to electrically couple the respective capacitor and electrode ground terminals to the flange.

12 Claims, 5 Drawing Sheets

ALIGNMENT PEDESTALS IN AN LDMOS POWER PACKAGE

BACKGROUND

1. Field of the Invention

The present invention pertains generally to the field of radio frequency (RF) power transistor devices and, more specifically, to methods and apparatus for assembling RF power packages for wireless communication applications.

2. Background

The use of RF power transistor devices as signal amplifiers in wireless communication applications is well known. With the considerable recent growth in the demand for wireless services, such as personal communication services, the operating frequency of wireless networks has increased dramatically and is now well into the gigahertz frequencies. At such high frequencies, laterally diffused, metal oxide semiconductor (LDMOS) transistors have been preferred for RF power amplification applications, e.g., for use in antenna base stations.

Referring to FIGS. 1–2, an exemplary LDMOS power transistor package (or "power package") 18 generally comprises a plurality of transistor elements connected to form respective electrodes 20 on a semiconductor die 22. The electrodes 20 are coupled to a common input (gate) terminal 24 and output (drain) terminal 26 formed on the top surface of the die 22. The electrodes 20 also share a common ground (source) terminal (not shown) formed on the underlying side of the die 22.

The die 22 is attached, e.g., by a known eutectic die attach process, to a top surface 28 of a conductive flange 30. In particular, the flange 30 serves as a combined ground current reference, heat spreader and mounting device for the power package 18, with the electrode ground terminal on the underside of the die 22 directly coupled to the flange surface 28.

A thermally conductive, but electrically isolating, e.g., aluminum oxide, "window" substrate 32 is attached to the mounting flange 30, surrounding the die 22. Respective input and output lead frames 34 and 36 are attached at opposing ends of a top surface 38 of the window substrate 32, electrically isolated from the flange 30. An input matching capacitor 40 comprising a silicon wafer with a gold alloy top-side terminal 41, is attached to the flange surface 28 between the input lead frame 34 and the die 22. A similarly constructed output matching capacitor 42 having a gold-alloy top-side terminal 43 is attached to the flange surface 28 between the die 22 and the output lead frame 36. The respective input and output matching capacitors 40 and 42 are typically attached to the flange surface 28 as part of the same eutectic scrubbing process used to attach the die 22.

In the input direction, a first plurality of wires 44 couple the input lead frame 34 to the input matching capacitor terminal 41, and a second plurality of wires 46 couple the input matching capacitor terminal 41 to the electrode input terminals 24. In the output direction, a third plurality of wires 48 couple the electrode output terminals 26 to the output blocking capacitor terminal 43, and a fourth plurality of wires couple the output blocking capacitor terminal 43 to the output lead frame 36.

As part of a large scale assembly of such LDMOS power packages, it is highly desirable to be able to attach the die and matching capacitors in the same relative locations on each mounting flange surface. While this may be readily accomplished using precise robotic die attach machines, such machines are relatively expensive and slow. The die attachment process may alternately be done manually, which is relatively fast and inexpensive. However, a manual attachment process requires use of a microscope with reticules for precisely measuring the desired distances, which can result in inconsistent results, since the reticules require re-calibration from operator to operator.

If the die or capacitors are placed on the flange surface inconsistently, the wire bond operator must change the wiring program (e.g., lengths and bond locations) to accommodate for the misplaced die or capacitor elements. Importantly, at such high operating frequencies, even small changes in bond wire lengths can significantly alter the performance of the power package, due to the corresponding changes in inductance through the transmission signal path.

Thus, it would be desirable to provide a relatively fast and inexpensive means for positioning the die and capacitor elements on the flange surface as part of the LDMOS power package assembly process.

SUMMARY OF THE INVENTION

An LDMOS power package includes a mounting substrate having a surface with one or more alignment pedestals extending therefrom. Each alignment pedestal has a mounting surface facing away from the substrate surface to provide for uniform positioning of various semiconductor elements, e.g., a transistor die or matching capacitors, relative to the substrate surface as part of a large scale production process. The respective pedestal mounting surfaces are preferably conductive, and are electrically coupled to the flange surface, so as to electrically couple the respective capacitor and electrode ground terminals to the flange.

As will be apparent to those skilled in the art, other and further aspects and advantages of the present invention will appear hereinafter.

BRIEF DESCRIPTION OF THE DRAWINGS

Preferred embodiments of the present invention are illustrated by way of example, and not by way of limitation, in the figures of the accompanying drawings, in which like reference numerals refer to like components, and in which.

DETAILED DESCRIPTION OF THE PREFERRED EMBODIMENTS

Figure 1:
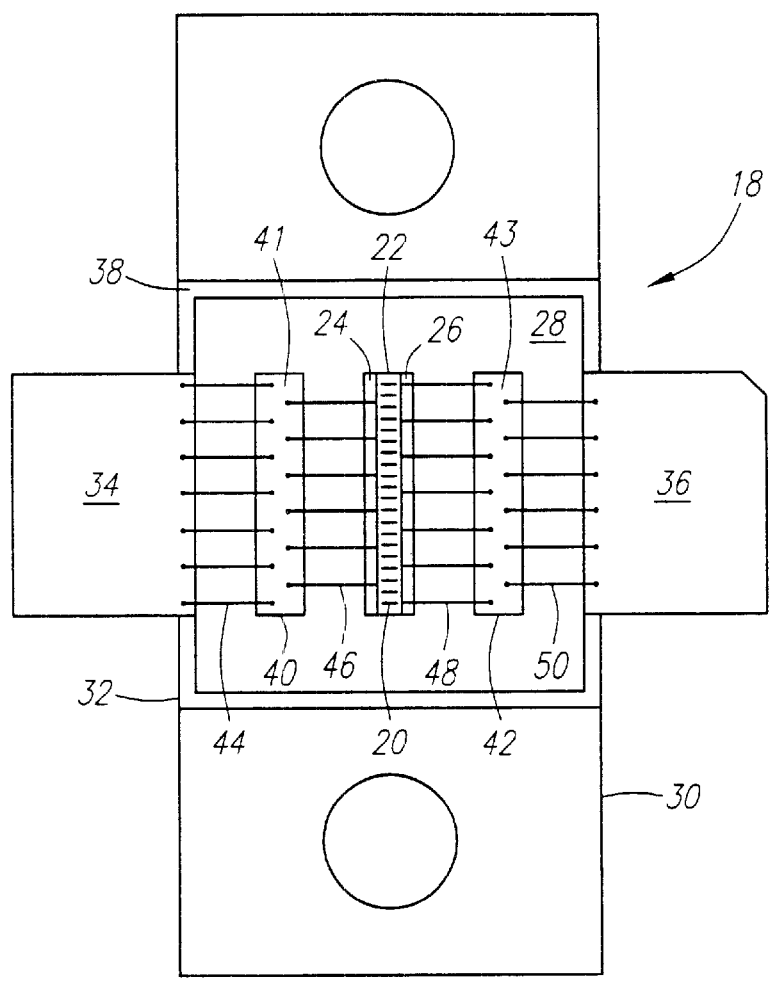
FIG. 1 is a top view of an exemplary known LDMOS power package.
Figure 2:
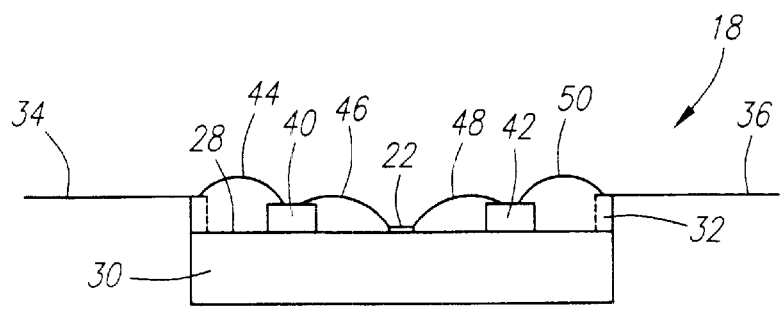
FIG. 2 is a cut-away end view of the power package of FIG. 1.
Figure 3:
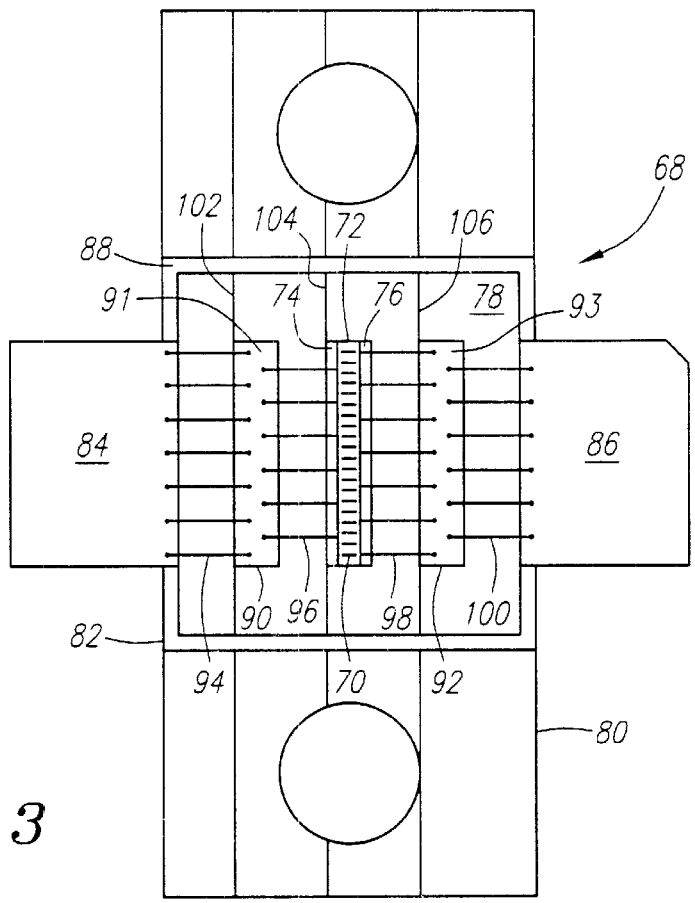
FIG. 3 is a top view of a preferred LDMOS power package constructed in accordance with a first aspect of the invention, including a plurality of marker elements formed in a mounting flange surface.

Referring to FIG. 3, a preferred LDMOS power package 68 constructed in accordance with a first aspect of the invention comprises a semiconductor die 72 having plurality of electrodes 70 formed thereon. The electrodes 70 are coupled to a common input (gate) terminal 74 and output (drain) terminal 76 formed on the top surface of the die 72. The electrodes 70 also share a common ground (source) terminal (not shown) formed on the underlying side of the die 72. The die 72 is attached to a top surface 78 of a conductive mounting flange 80. The mounting flange 80 serves as a combined ground current reference, heat spreader and mounting device for the power package 68, with the electrode ground terminal on the underside of the die 72 directly coupled to the flange surface 78.

An electrically isolating window substrate 82 is attached to the flange 80, surrounding the die 72. Respective input and output lead frames 84 and 86 are attached at opposing ends of a top surface 88 of the window substrate 82, electrically isolated from the flange 80. An input matching capacitor 90, e.g., comprising a silicon wafer with a gold alloy top-side terminal 91, is attached to the flange surface 78 between the input lead frame 84 and the die 72. A similarly constructed output matching capacitor 92 having a gold-alloy top-side terminal 93 is attached to the flange surface 78 between the die 72 and the output lead frame 86. The respective input and output matching capacitors 90 and 92 are typically attached to the flange surface 78 as part of the same eutectic scrubbing process used to attach the die 72.

In the input direction, a first plurality of wires 94 couple the input lead frame 84 to the input matching capacitor terminal 91, and a second plurality of wires 96 couple the input matching capacitor terminal 91 to the electrode input terminals 74. In the output direction, a third plurality of wires 98 couple the electrode output terminals 76 to the output blocking capacitor terminal 93, and a fourth plurality of wires couple the output blocking capacitor terminal 93 to the output lead frame 86.

Figure 4:
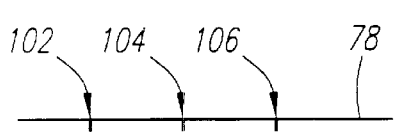
FIG. 4 is a cut-away end view of a first preferred embodiment of the power package of FIG. 3, wherein the marker elements comprise lines etched or otherwise cut into the mounting flange surface.
Figure 5:
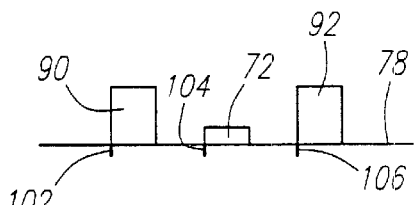
FIG. 5 further illustrates a plurality of circuit elements mounted on the flange surface of the embodiment of FIG. 4.

In accordance with this first aspect of the invention, a plurality of substantially parallel marker lines 102, 104 and 106 are formed in the top surface 78 of the mounting flange 80. As best seen in FIG. 4, the marker lines may be chemically etched, mechanically cut, or otherwise formed in the mounting flange surface 78 by a number of conventional means, preferably prior to attachment of the window substrate 82. As best seen in FIG. 5, the marker lines 102, 104 and 106 are used as alignment guides for placing the respective input matching capacitor 90, electrode die 72 and output matching capacitor 92 on the flange surface 78 during the assembly process.

In alternative preferred embodiments, the marker lines 102, 104 and 106 may take the form of raised abutments against which the respective die 72 and matching capacitor elements 90 and 92 are positioned.

Figure 6:
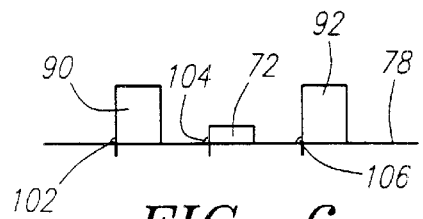
FIG. 6 is a cut-away end view of a second preferred embodiment of the power package of FIG. 3, wherein the marker elements comprise triangular abutments formed in the flange surface, against which a respective plurality of circuit elements are positioned.
Figure 6A:
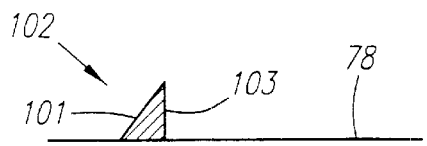
FIG. 6A is an enlarged view of a triangular marker element in the embodiment of FIG. 6.

By way of one example, in the embodiment shown in FIGS. 6–6A, the marker lines 102, 104 and 106 are in the form of raised triangular-shaped protrusions 101. Each protrusion 103 has a substantially perpendicular edge 103 relative to the flange surface 78, against which the respective input matching capacitor 90, die 72, and output matching capacitor 94 are positioned during the assembly process.

Figure 7:
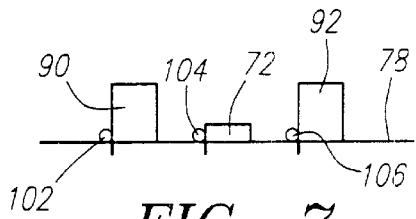
FIG. 7 is a cut-away end view of a third preferred embodiment of the power package of FIG. 3, wherein the marker elements comprise rectangular protrusions extending from the flange surface, against which a respective plurality of circuit elements are positioned.
Figure 7A:
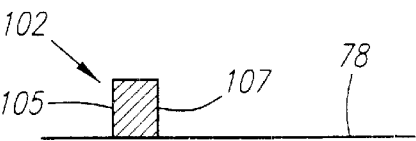
FIG. 7A is an enlarged view of a rectangular marker element in the embodiment of FIG. 7.

By way of another example, in the embodiment shown in FIGS. 7–7A, the marker lines 102, 104 and 106 are in the form of raised rectangular-shaped protrusions 105. Each protrusion 105 has a substantially perpendicular edge 107 relative to the flange surface 78, against which the respective input matching capacitor 90, die 72, and output matching capacitor 94 are positioned during the assembly process.

As will be appreciated by those skilled in the art, the marker lines may vary in number and relative spacing on the flange surface 78, depending on specific design considerations. Further, the marker lines may take any number of further shapes and dimensions in providing an alignment guide for placement of the respective elements on the flange surface 78.

Figure 8:
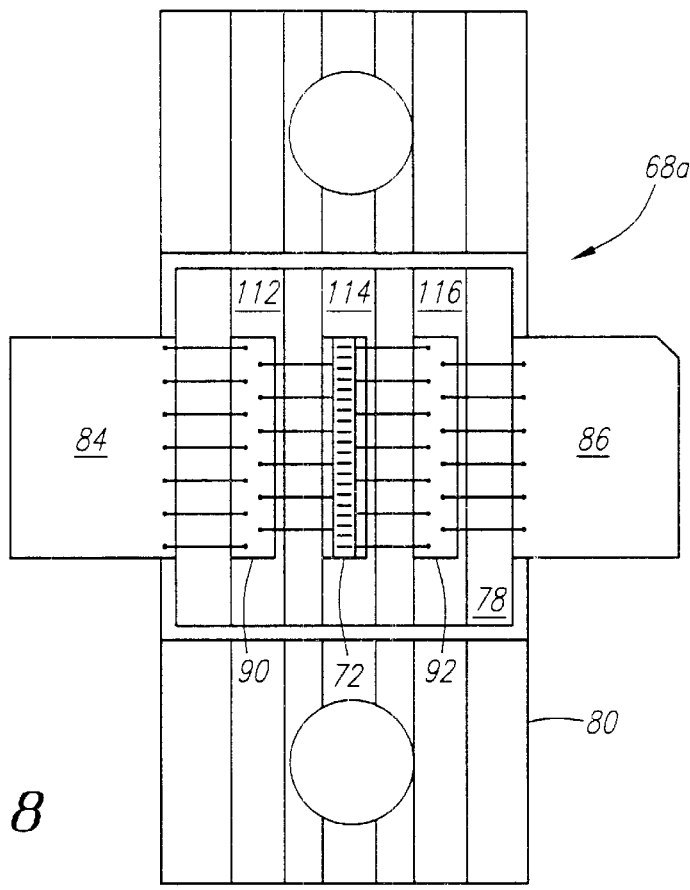
FIG. 8 is a top view of a preferred LDMOS power package constructed in accordance with a further aspect of the invention, including a plurality of alignment troughs formed in the mounting flange surface.

In accordance with a further aspect of the invention, FIG. 8 depicts an alternate preferred LDMOS power package, designated as 68a. Instead of marker lines or abutments, a plurality of substantially parallel alignment troughs 112, 114 and 116 are formed in the top surface 78 of the mounting flange 80 of package 68a. In addition to providing an alignment mechanism for positioning the respective semiconductor elements on the flange surface 78, the alignment troughs 112, 114 and 116 limit movement, and in particular lateral movement, of the elements during the eutectic attachment process. In accordance with this aspect of the invention, the alignment troughs 112, 114 and 116 may vary in dimension. For ease in illustration, FIGS. 9–11 show only the die alignment trough 114, although the same discussion would apply to the capacitor alignment troughs 112 and 116.

Figure 9:
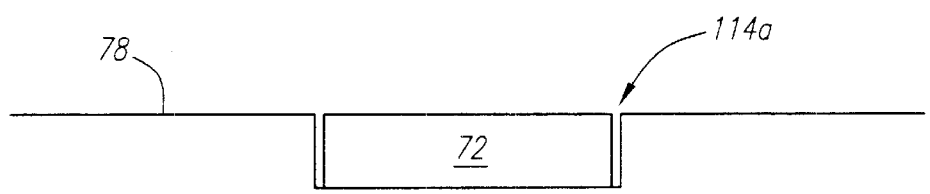
FIG. 9 is a cut-away partial end view of a first preferred embodiment of the power package of FIG. 8, in which the die alignment trough is sized to snuggly fit the die.

In particular, in a preferred embodiment depicted in FIG. 9, the die alignment trough, designated as 114a, is narrowly sized to snuggly fit the die 72. This relatively tight tolerance prevents lateral movement of the die 72 within the trough 114 in order to provide for consistent alignment of the die 72 on the flange surface 78. However, placement of the relatively small die 72 into the relatively narrow trough 114a requires precision die mounting equipment. Further, attachment of the die 72, e.g., by a eutectic scrubbing process, may be hindered if no lateral movement of the die 72 is possible.

Figure 10:
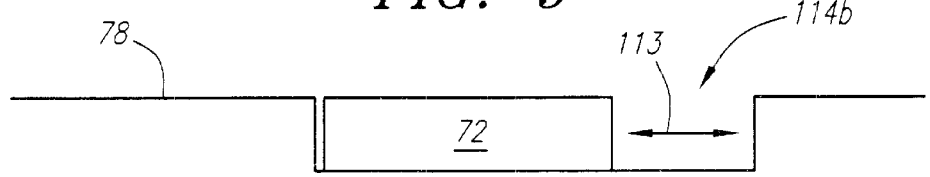
FIG. 10 is a cut-away partial end view of a second preferred embodiment of the power package of FIG. 8, in which the die alignment trough is sized to allow lateral movement of the die.

In an alternate preferred embodiment depicted in FIG. 10, the die alignment trough, designated as 114b, is more liberally sized to allow for lateral movement of the die 72, as indicated by arrow 113. The exact width of the trough 114b is a design choice, depending on the relative importance of uniform placement versus proving some lateral movement during the attachment process.

Figure 11:
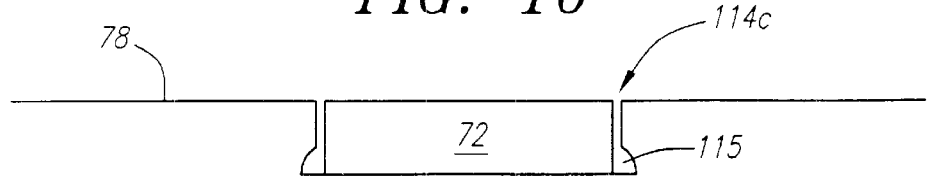
FIG. 11 is a cut-away partial end view of a third preferred embodiment of the power package of FIG. 8, in which the die alignment trough is provided with a widened base portion.

In a still further preferred embodiment depicted in FIG. 11, the die alignment trough, designated as 114c, is provided with a widened base portion 115. In particular, the widened base portion acts as a reservoir for excess material pushed aside during the die attach process, so that the underside of die 72 remains in close contact with the flange surface 78.

Figure 12:
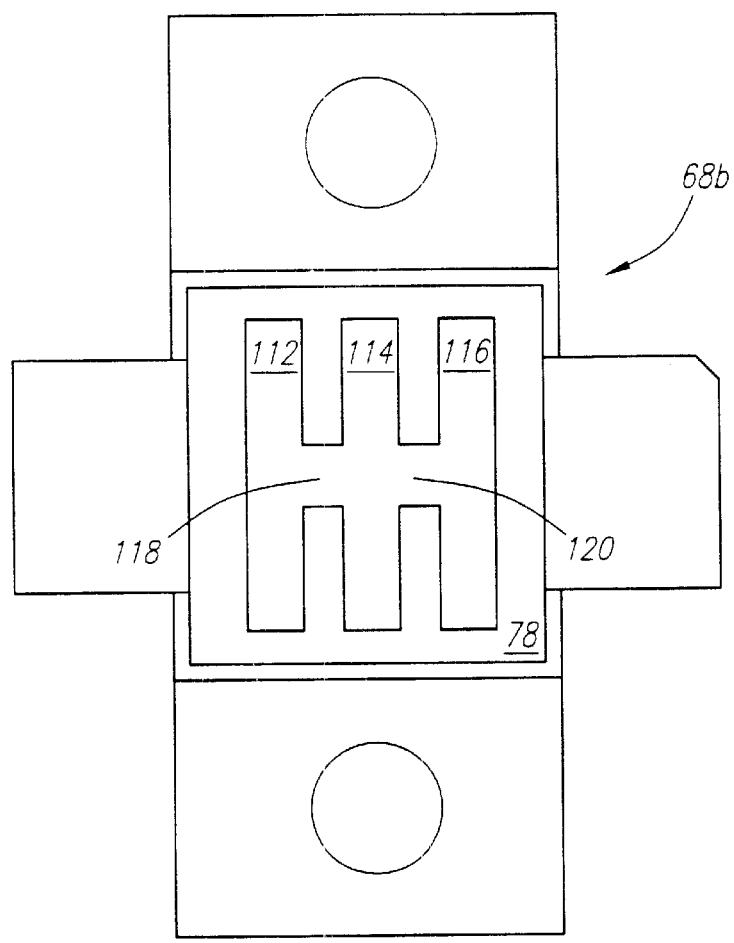
FIG. 12 is a top view of a preferred LDMOS power package constructed in accordance with a yet another aspect of the invention, including a plurality of interconnected alignment troughs formed in the mounting flange surface.

FIG. 12 depicts a still further preferred LDMOS power package, designated as 68b, wherein the respective alignment troughs 112, 114 and 116 are interconnected. In FIG. 12, the respective circuit elements (e.g., the matching capacitors and electrode die) are omitted for ease in illustration. In this embodiment, the troughs 112 and 114 are connected by a first channel 118, and alignment troughs 114 and 116 are connected by a second channel 120. The channels 118 and 120 provide respective reservoirs for excess material pushed aside during the die (and capacitor) attachment process.

Figure 13:
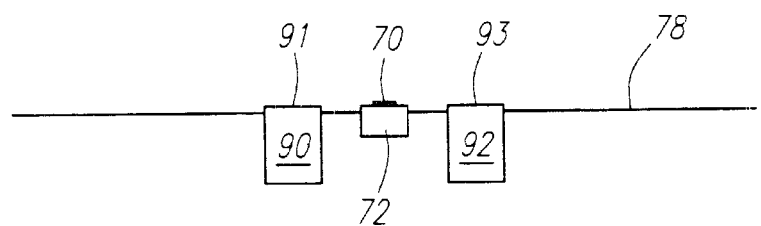
FIG. 13 is a cut-away end view of the power package of FIG. 13.

Notably, the depth of the respective alignment troughs 112, 114 and 116 may vary and is a design choice. For example, in at least one preferred embodiment depicted in FIG. 13, the alignment troughs 112, 114 and 116 are each sized to accommodate the respective height of the element seated therein, such that the top-side of each element is substantially the same. Because the electrode die 72 typically has a much shorter profile than do the input and output matching capacitors 90 and 92, the die alignment trough 114 is much more shallow than the respective capacitor alignment troughs 112 and 116.

Figure 14:
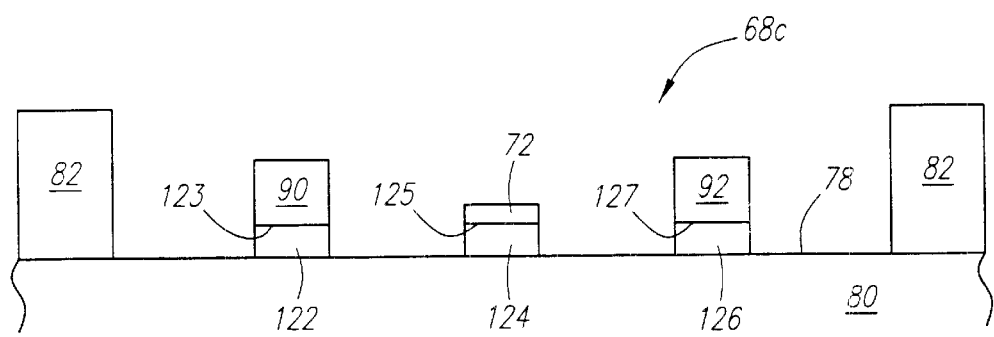
FIG. 14 is a cut-away end view of a further preferred LDMOS power package constructed in accordance with a yet another aspect of the invention, the package including a plurality of alignment pedestals extending from the mounting flange surface.

In accordance with yet another aspect of the invention, FIG. 14 depicts a further preferred LDMOS power package, designated as 68c, wherein, instead of marker lines, abutments or troughs, a plurality of substantially parallel alignment pedestals are used.

Figure 15:
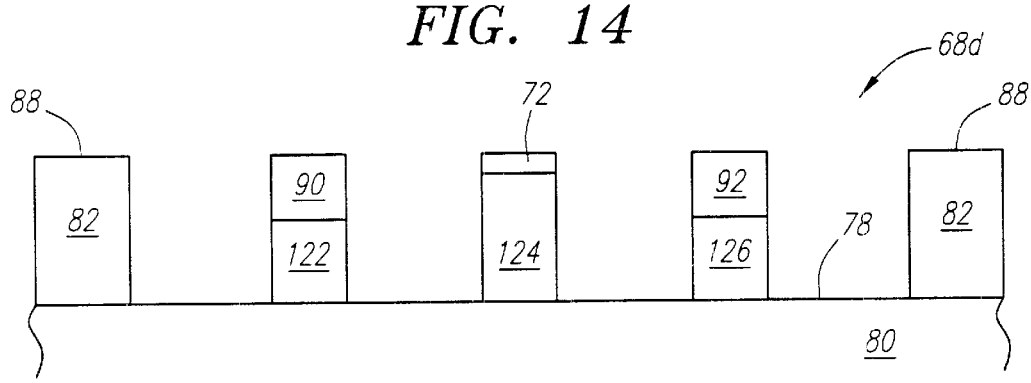
FIG. 15 is a cut-away end view of an alternate preferred LDMOS power package employing alignment pedestals.

In particular, a first alignment pedestal 122 extends from the flange surface 78 and has a top surface 123 sized to accommodate placement of the input matching capacitor 90. A second alignment pedestal 124 extends from the flange surface 78 and has a top surface 125 sized to accommodate placement of the electrode die 72. A third alignment pedestal 126 extends from the flange surface 78 and has a top surface 127 sized to accommodate placement of the output matching capacitor 92. The actual dimensions of the respective pedestal surfaces 123, 125 and 127 are design choices and can be relatively narrowly tailored to just accommodate the respective elements 90, 72 and 92, or can be wider to allow for lateral movement FIG. 15 depicts an alternate preferred power package in accordance with this aspect, designated as 68d, in which the alignment pedestals 122, 124 and 126 are sized such that the respective top surfaces of the input capacitor 90, die 72 and output capacitor 92 are approximately the same distance from the flange surface 78. Further, the alignment pedestals 122, 124 and 126 are preferably sized such that the respective top surfaces of the input capacitor 90, die 72 and output capacitor 92 are substantially even with the top surface of the window substrate 82. In this manner, the lengths of the various bond wires (not shown) coupling the respective elements to the input and output terminals are minimized, minimizing their inductance. In an alternate embodiment (not shown), only the die 72 is mounted on an alignment pedestal, wherein the alignment pedestal is sized such that the top-side of the die 72 and the top-side matching capacitor terminals 91 and 93 are approximately the same distance from the flange surface 78.

Figure 16:
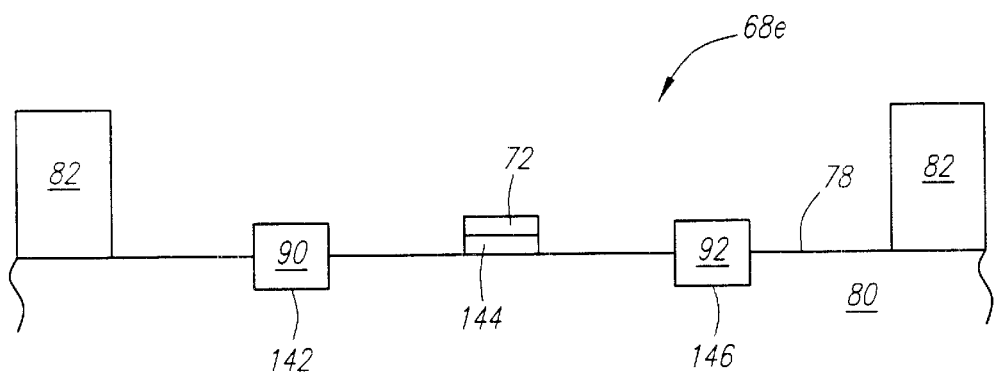
FIG. 16 is a cut-away end view of a still further preferred LDMOS power package employing a combination of alignment pedestals and troughs.

A still further preferred power package, designated as 68e, is shown in FIG. 16. In this embodiment, the input and output matching capacitors 90 and 92 are positioned in respective alignment troughs 142 and 146, while the electrode die is positioned on an alignment pedestal 144. Notably, the depth of the alignment troughs 142 and 146, as well as the height of the alignment pedestal 144, are such that the respective top surfaces of the input capacitor 90, die 72 and output capacitor 92 are substantially the same distance from the flange surface 78.

With reference again to FIG. 14, the respective mounting surfaces 123, 125 and 127 are preferably conductive, and are electrically coupled to the flange surface 78, so as to electrically couple the respective capacitor and electrode ground terminals to the flange 80.

Figure 17:
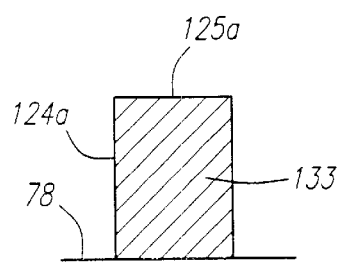
FIG. 17 is a side view of a first exemplary alignment pedestal.

Towards this end, a first exemplary alignment pedestal 124a is shown in FIG. 17, wherein a conductive (e.g., metal) surface layer 133 extends at least partially over one or more sides of the pedestal 124a, electrically coupling the flange surface 78 with the pedestal mounting surface 125a.

Figure 18:
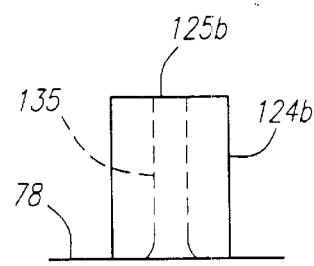
FIG. 18 is a side view of a second exemplary alignment pedestal.

A second exemplary alignment pedestal 124b is shown in FIG. 18. In this embodiment, a conductive (e.g., metal plated) via 135 is used to electrically couple the flange surface 78 with the pedestal mounting surface 125b.

While preferred embodiments and applications of the present invention have been shown and described, as would be apparent to those skilled in the art, many modifications and applications are possible without departing from the inventive concepts herein.

Thus, the scope of the disclosed invention is not to be restricted except in accordance with the appended claims.

What is claimed is:

1. An LDMOS power package, comprising:
   a conductive substrate;
   an alignment pedestal extending from the substrate, the alignment pedestal having a conductive mounting surface electrically coupled to the substrate; and
   a transistor die having a top-side electrode terminal and an underlying ground terminal, the ground terminal attached to the pedestal mounting surface.

2. The power package of claim 1, wherein the pedestal mounting surface is electrically coupled to the substrate by a conductive via extending through the alignment pedestal.

3. The power package of claim 1, wherein the pedestal mounting surface is electrically coupled to the substrate by a conductive layer covering at least a portion of the alignment pedestal.

4. The power package of claim 1, further comprising a matching capacitor attached to, and extending from the substrate, the matching capacitor having a conductive top-side terminal and a dielectric region, the alignment pedestal sized such that the top-side electrode terminal and top-side capacitor terminal are approximately the same distance from the substrate.

5. The power package of claim 1, wherein the pedestal mounting surface is sized to accommodate relative movement of the transistor die during a eutectic die attach process.

6. An LDMOS power package, comprising:
a conductive substrate having a surface;
a plurality of alignment pedestals extending from the substrate surface;
an input matching capacitor having a conductive top-side terminal and a conductive ground terminal separated by a dielectric region, the capacitor ground terminal attached to a conductive surface of a first alignment pedestal; and
a transistor die having top-side electrode input and output terminals, and an underlying electrode ground terminal, the electrode ground terminal attached to a conductive surface of a second alignment pedestal.

7. The power package of claim 6, wherein the respective first and second alignment pedestals are sized such that the top-side electrode terminals and top-side capacitor terminal are approximately the same distance from the substrate.

8. The power package of claim 6, wherein the conductive surfaces of the first and second alignment pedestals are electrically coupled to the substrate by conductive vias extending through the respective alignment pedestals.

9. The power package of claim 6, wherein the conductive surfaces of the first and second alignment pedestals are electrically coupled to the substrate by a respective conductive layer covering at least a portion of the respective alignment pedestals.

10. The power package of claim 6, wherein the conductive surfaces of the first and second alignment pedestals are sized to accommodate movement of the respective capacitor and transistor die during a eutectic attachment process.

11. The power package of claim 6, further comprising an output matching capacitor having a conductive top-side terminal and a conductive ground terminal separated by a dielectric region, the capacitor ground terminal attached to a conductive surface of a third alignment pedestal.

12. An LDMOS power transistor package, comprising
a conductive substrate having a surface the substrate surface comprising a plurality of alignment elements;
an input matching capacitor mounted on the substrate surface proximate a first alignment element;
a semiconductor die mounted on the substrate surface proximate a second alignment element; and
an output blocking capacitor coupled to the substrate surface proximate a third alignment element,
wherein at least one alignment element comprises a trough formed in the flange surface, and
wherein at least one alignment element comprises a pedestal extending from a flange surface.

* * * * *